United States Patent
McVittie et al.

(10) Patent No.: US 9,612,433 B2
(45) Date of Patent: Apr. 4, 2017

(54) RESONANT SYSTEM EXCITATION POWER REDUCTION USING DYNAMIC PHASE OFFSET

(71) Applicant: Microvision, Inc., Redmond, WA (US)

(72) Inventors: Patrick J. McVittie, Seattle, WA (US); Jonathan A. Morarity, Seattle, WA (US); Damon M. Domjan, Redmond, WA (US)

(73) Assignee: Microvision, Inc., Redmond, WA (US)

( * ) Notice: Subject to any disclaimer, the term of this patent is extended or adjusted under 35 U.S.C. 154(b) by 0 days.

(21) Appl. No.: 14/718,508

(22) Filed: May 21, 2015

(65) Prior Publication Data

US 2016/0341955 A1    Nov. 24, 2016

(51) Int. Cl.
   *G02B 26/08*  (2006.01)
   *G02B 26/10*  (2006.01)
   *G02B 27/01*  (2006.01)

(52) U.S. Cl.
   CPC ......... *G02B 26/0841* (2013.01); *G02B 26/10* (2013.01); *G02B 27/0101* (2013.01)

(58) Field of Classification Search
   CPC .................. G02B 26/105; G02B 26/101; G02B 26/0833; G02B 26/085; G02B 26/0841; G02B 26/10; G02B 27/0101
   USPC .................. 359/198.1–199.4, 200.6–200.8, 359/201.1–202.1, 212.1–226.2
   See application file for complete search history.

(56) References Cited

U.S. PATENT DOCUMENTS

| | | | |
|---|---|---|---|
| 2004/0119811 A1* | 6/2004 | Bush | B41J 2/47 347/237 |
| 2007/0152129 A1 | 7/2007 | Li et al. | |
| 2011/0080533 A1 | 4/2011 | Champion et al. | |
| 2011/0127404 A1 | 6/2011 | Yen | |
| 2011/0205498 A1 | 8/2011 | Brown et al. | |
| 2012/0281024 A1 | 11/2012 | Champion | |
| 2013/0229698 A1* | 9/2013 | Honda | G02B 26/085 359/199.3 |

OTHER PUBLICATIONS

Microvision, Inc. "International Search Report and Written Opinion", Jul. 28, 2016.

* cited by examiner

*Primary Examiner* — James Phan
(74) *Attorney, Agent, or Firm* — Kevin D. Wills

(57) ABSTRACT

A drive circuit for a resonant system provides an excitation signal having an amplitude and a phase. The resonant system provides a feedback signal representing an oscillation amplitude. The amplitude of the excitation signal is reduced for a substantially constant feedback signal amplitude by modifying the excitation signal phase.

14 Claims, 12 Drawing Sheets

RESONANT SYSTEM EXCITATION POWER REDUCTION USING DYNAMIC PHASE OFFSET

FIELD

The present invention relates generally to resonant systems, and more specifically to excitation of resonant systems.

BACKGROUND

Resonant systems present familiar design challenges. When trying to control a resonant system at a peak of a resonant mode, a feedback control circuit is commonly employed to produce an excitation signal in an attempt to keep the system resonating at a particular frequency. Components within the feedback control circuit can have differing characteristics that increase the design challenges. For example, components may have characteristics that drift with time, age, and temperature.

DESCRIPTION OF EMBODIMENTS

Figure 1:
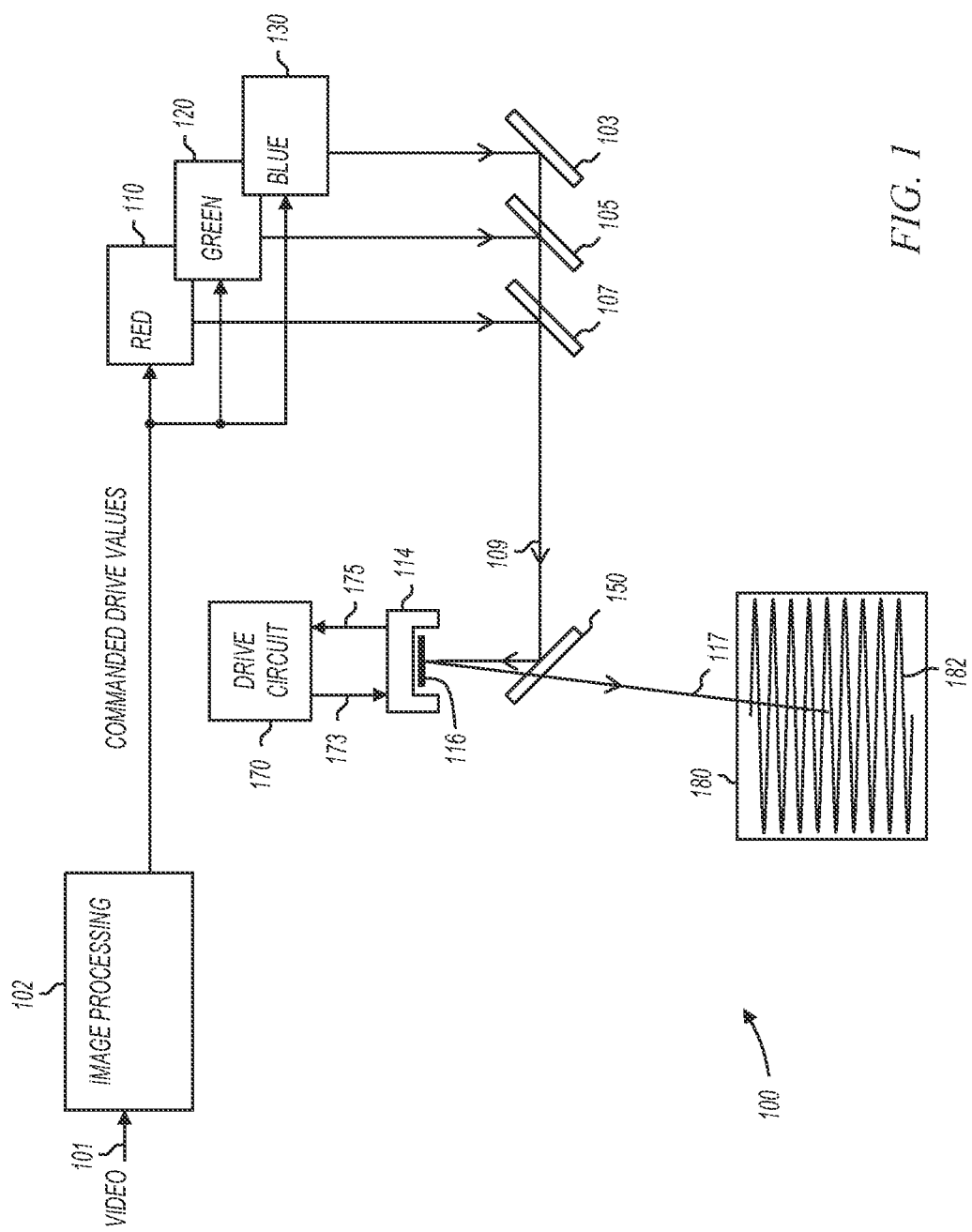
FIG. 1 shows a scanning laser projector in accordance with various embodiments of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the scope of the invention. In addition, it is to be understood that the location or arrangement of individual elements within each disclosed embodiment may be modified without departing from the scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 shows a scanning laser projector in accordance with various embodiments of the present invention. Scanning laser projector 100 includes image processing component 102, red laser module 110, green laser module 120, and blue laser module 130. Light from the laser modules is combined with dichroics 103, 105, and 107. Scanning laser projector 100 also includes fold mirror 150, drive circuit 170, and MEMS device 114 with scanning mirror 116.

In operation, image processing component 102 processes video content at 101 using two dimensional interpolation algorithms to determine the appropriate spatial image content for each scan position at which an output pixel is to be displayed. This content is then mapped to a commanded current for each of the red, green, and blue laser sources such that the output intensity from the lasers is consistent with the input image content. In some embodiments, this process occurs at output pixel rates in excess of 150 MHz.

The laser beams are then directed onto an ultra-high speed gimbal mounted 2 dimensional bi-axial laser scanning mirror 116. In some embodiments, this bi-axial scanning mirror is fabricated from silicon using MEMS processes. The vertical axis of rotation is operated quasi-statically and creates a vertical sawtooth raster trajectory. The vertical axis is also referred to as the slow-scan axis. The horizontal axis is operated on a resonant vibrational mode of the scanning mirror. In some embodiments, the MEMS device uses electromagnetic actuation, achieved using a miniature assembly containing the MEMS die and small subassemblies of permanent magnets and an electrical interface, although the various embodiments are not limited in this respect. For example, some embodiments employ electrostatic or piezoelectric actuation. Any type of mirror actuation may be employed without departing from the scope of the present invention. The horizontal resonant axis is also referred to as the fast-scan axis.

In some embodiments, raster scan 182 is formed by combining a sinusoidal component on the horizontal axis and a sawtooth component on the vertical axis. In these embodiments, output beam 117 sweeps back and forth left-to-right in a sinusoidal pattern, and sweeps vertically (top-to-bottom) in a sawtooth pattern with the display blanked during flyback (bottom-to-top). FIG. 1 shows the sinusoidal pattern as the beam sweeps vertically top-to-bottom, but does not show the flyback from bottom-to-top.

In other embodiments, the vertical sweep is controlled with a triangular wave such that there is no flyback. In still further embodiments, the vertical sweep is sinusoidal. The various embodiments of the invention are not limited by the waveforms used to control the vertical and horizontal sweep or the resulting raster pattern.

A mirror drive circuit 170 provides a drive signal to MEMS device 114 on node 173. The drive signal includes an excitation signal to control the resonant angular motion of scanning mirror 116 on the fast-scan axis, and also includes slow-scan drive signal to cause deflection on the slow-scan axis. The resulting mirror deflection on both the fast and slow-scan axes causes output beam 117 to generate a raster scan 182 in field of view 180. In operation, the laser light sources produce light pulses for each output pixel and scanning mirror 116 reflects the light pulses as beam 117 traverses the raster pattern.

Mirror drive circuit 170 also receives a feedback signal from MEMS device 114 on node 175. The feedback signal on node 175 provides information regarding the position of scanning mirror 116 on the fast-scan axis as it oscillates at a resonant frequency. In some embodiments, the feedback signal describes the instantaneous angular position of the mirror, and in other embodiments, the feedback signal describes the maximum deflection angle of the mirror, also referred to herein as the amplitude of the feedback signal.

In operation, drive circuit 170 excites resonant motion of scanning mirror 116 such that the amplitude of the feedback signal is constant. This provides for a constant maximum angular deflection on the fast-scan axis as shown in raster scan 182.

As described further below, the excitation signal used to excite resonant motion of scanning mirror 116 includes an amplitude and a phase. Drive circuit 170 includes a first feedback circuit that modifies the excitation signal amplitude to keep the feedback signal amplitude substantially constant. Drive circuit 170 also includes a second feedback loop that modifies the excitation signal phase as a function of the excitation signal amplitude to reduce the excitation signal amplitude while still providing for a substantially constant feedback amplitude.

Drive circuit 170 may be implemented in hardware, a programmable processor, or in any combination. For example, in some embodiments, drive circuit 170 is implemented in an application specific integrated circuit (ASIC). Further, in some embodiments, some of the faster data path control is performed in an ASIC and overall control is provided by a software programmable microprocessor. Examples of drive circuit implementations are described further below.

Although red, green, and blue laser light sources are shown in FIG. 1, the various embodiments of the invention are not limited by the wavelength of light emitted by the laser light sources. For example, in some embodiments, non-visible light (e.g., infrared light) is emitted instead of, or in addition to, visible light.

Figure 2:
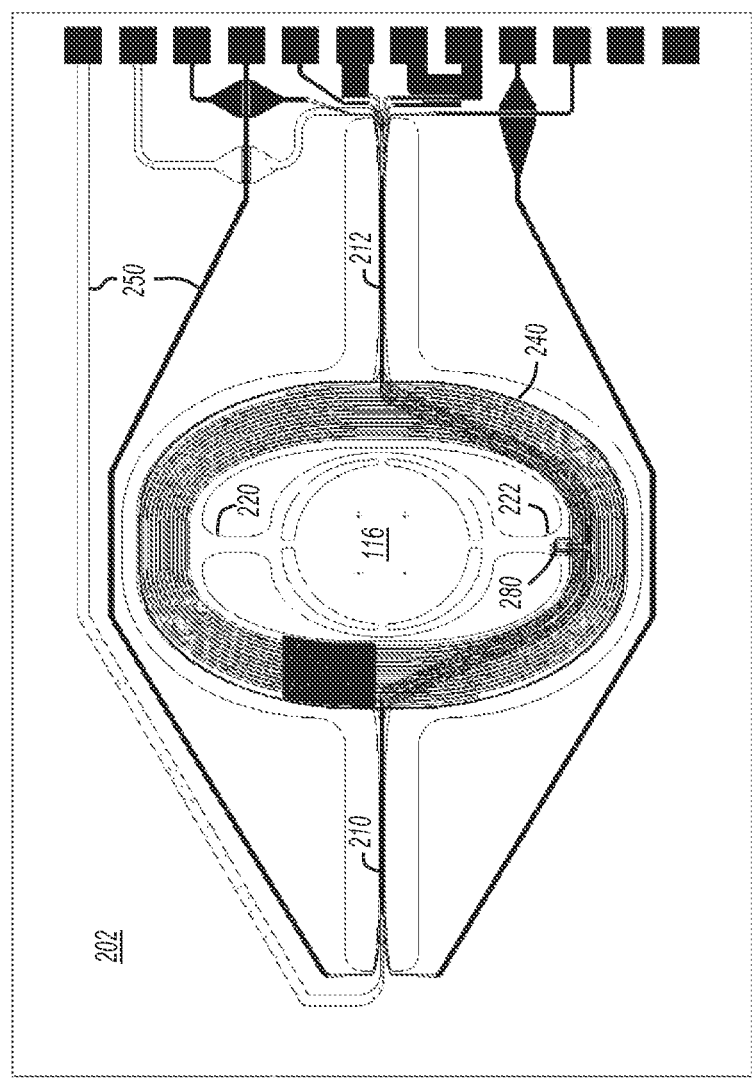
FIG. 2 shows a plan view of a microelectromechanical system (MEMS) device with a scanning mirror in accordance with various embodiments of the present invention.

FIG. 2 shows a plan view of a microelectromechanical system (MEMS) device with a scanning mirror. MEMS device 114 includes fixed platform 202, scanning platform 240, and scanning mirror 116. Scanning platform 240 is coupled to fixed platform 202 by flexures 210 and 212, and scanning mirror 116 is coupled to scanning platform 240 by flexures 220 and 222. Scanning platform 240 has a drive coil connected to drive lines 250, which are driven by a drive signal provided on node 173 from drive circuit 170 (FIG. 1). The drive signal includes an excitation signal to excite resonant motion of scanning mirror 116 on the fast-scan axis, and also includes a slow-scan drive signal to cause non-resonant motion of scanning platform 240 on the slow-scan axis. Current driven into drive lines 250 produces a current in the drive coil.

In operation, an external magnetic field source (not shown) imposes a magnetic field on the drive coil. The magnetic field imposed on the drive coil by the external magnetic field source has a component in the plane of the coil, and is oriented non-orthogonally with respect to the two drive axes. The in-plane current in the coil windings interacts with the in-plane magnetic field to produce out-of-plane Lorentz forces on the conductors. Since the drive current forms a loop on scanning platform 240, the current reverses sign across the scan axes. This means the Lorentz forces also reverse sign across the scan axes, resulting in a torque in the plane of and normal to the magnetic field. This combined torque produces responses in the two scan directions depending on the frequency content of the torque.

The long axis of flexures 210 and 212 form a pivot axis. Flexures 210 and 212 are flexible members that undergo a torsional flexure, thereby allowing scanning platform 240 to rotate on the pivot axis and have an angular displacement relative to fixed platform 202. Flexures 210 and 212 are not limited to torsional embodiments as shown in FIG. 2. For example, in some embodiments, flexures 210 and 212 take on other shapes such as arcs, "S" shapes, or other serpentine shapes. The term "flexure" as used herein refers to any flexible member coupling a scanning platform to another platform (scanning or fixed), and capable of movement that allows the scanning platform to have an angular displacement with respect to the other platform.

Scanning mirror 116 pivots on a first axis formed by flexures 220 and 222, and pivots on a second axis formed by flexures 210 and 212. The first axis is referred to herein as the horizontal axis or fast-scan axis, and the second axis is referred to herein as the vertical axis or slow-scan axis. The distinction between vertical and horizontal is somewhat arbitrary, since a rotation of the projection apparatus will cause a rotation of the two axes. Accordingly, the various embodiments of the present invention are not to be limited by the terms "horizontal" and "vertical."

In some embodiments, scanning mirror 116 scans at a mechanically resonant frequency on the horizontal axis resulting in a sinusoidal horizontal sweep. Further, in some embodiments, scanning mirror 116 scans vertically at a nonresonant frequency, so the vertical scan frequency can be controlled independently.

MEMS device 114 also incorporates one or more integrated piezoresistive position sensors. Piezoresistive sensor 280 produces a voltage that represents the displacement of mirror 116 with respect to scanning platform 240, and this voltage is provided as the feedback signal on node 175 (FIG. 1). As shown in FIG. 2, in some embodiments, positions sensors are provided on one scan axis, although this is not a limitation of the present invention. For example, in some embodiments, MEMS device 114 includes a position sensor for both axes.

The particular MEMS device embodiment shown in FIG. 2 is provided as an example, and the various embodiments of the invention are not limited to this specific implementation. For example, any scanning mirror capable of sweeping in two dimensions to reflect a light beam in a raster pattern may be incorporated without departing from the scope of the present invention. Also for example, any combination of scanning mirrors (e.g., two mirrors: one for each axis) may be utilized to reflect a light beam in a raster pattern. Further, any type of mirror drive mechanism may be utilized without departing from the scope of the present invention. For example, although MEMS device 114 uses a drive coil on a moving platform with a static magnetic field, other embodiments may include a magnet on a moving platform with drive coil on a fixed platform. Further, the mirror drive mechanism may include an electrostatic drive mechanism.

Figure 3:
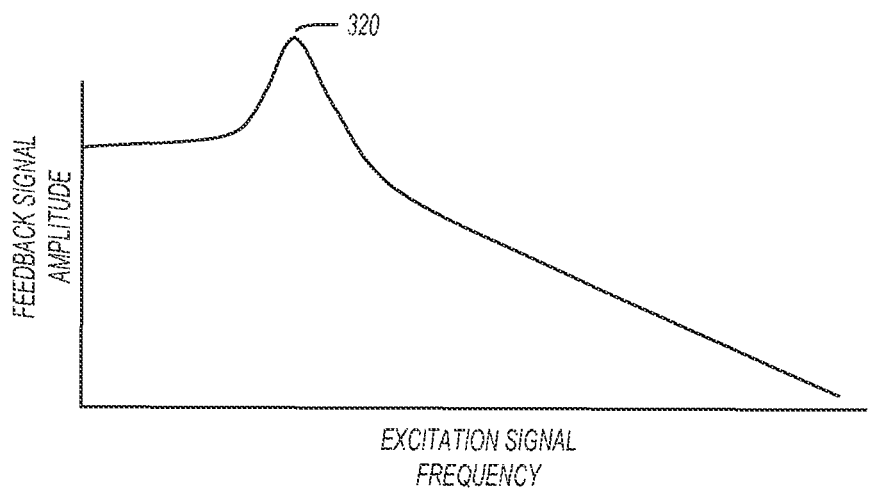
FIG. 3 shows a plot of feedback signal amplitude versus excitation signal frequency in accordance with various embodiments of the present invention.

FIG. 3 shows a plot of feedback signal amplitude versus excitation signal frequency in accordance with various embodiments of the present invention. The plot shown in FIG. 3 represents a peak-detected voltage provided by piezoresistive sensor 280 in MEMS device 114 as a function of excitation signal frequency. The large amplitude at 320 represents a dominant resonant mode of MEMS device 114 in which scanning mirror 116 angularly oscillates back and forth about an axis of desired motion. In some embodiments, this resonant mode corresponds to horizontal motion about the fast-scan axis.

As described more fully below, drive circuit 170 excites resonant motion of MEMS device 114 using a digital phase lock loop (PLL) that locks the excitation signal frequency to the frequency of a specific resonant mode such as mode 320.

Figure 4:
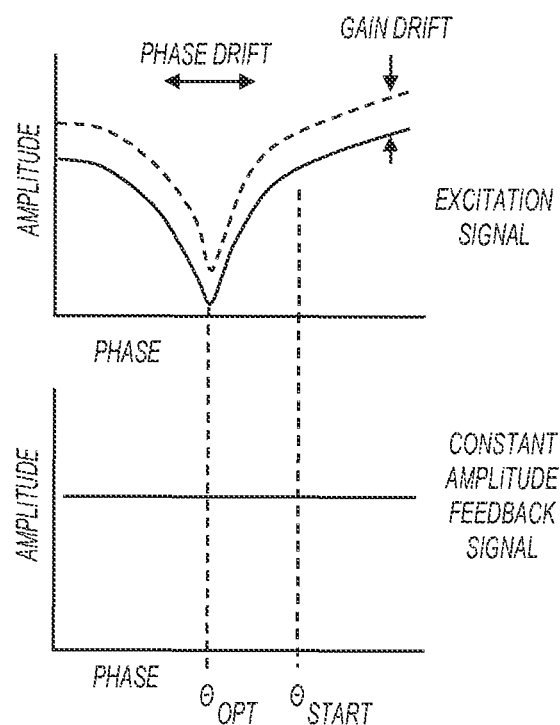
FIG. 4 shows a plot of excitation signal amplitude as a function of phase offset for a constant amplitude feedback signal in accordance with various embodiments of the present invention.

In some embodiments, the resonant response of MEMS device 114 is not only sensitive to the frequency of the excitation signal, but is also sensitive to the phase of the excitation signal. For example, referring now to FIG. 4, the excitation signal amplitude may increase for non-optimal phase values for a substantially constant amplitude feedback. As shown in FIG. 4, the resonance peak as a function of phase may be extremely sharp. A very slight modification in the phase of the excitation signal can cause a change in the excitation signal amplitude so that the efficiency of the resonant MEMS drops by 50% to 80% or more. This increased power in the excitation signal can cause localized heating in the drive coil, which may exacerbate the problem by shifting the frequency of the resonant mode and decreasing efficiency even further.

As described below with reference to later figures, drive circuit 170 includes a drive amplitude reduction circuit that adaptively modifies the excitation signal phase to reduce the excitation signal amplitude while maintaining the feedback signal amplitude substantially constant. For example, the drive amplitude reduction circuit may adjust the excitation signal phase from a starting phase value $\Theta_{START}$ to a near optimum phase value $\Theta_{OPT}$. The near optimum phase value is determined as the phase value that allows the lowest excitation signal amplitude while still maintaining a substantially constant feedback signal amplitude.

Figure 5:
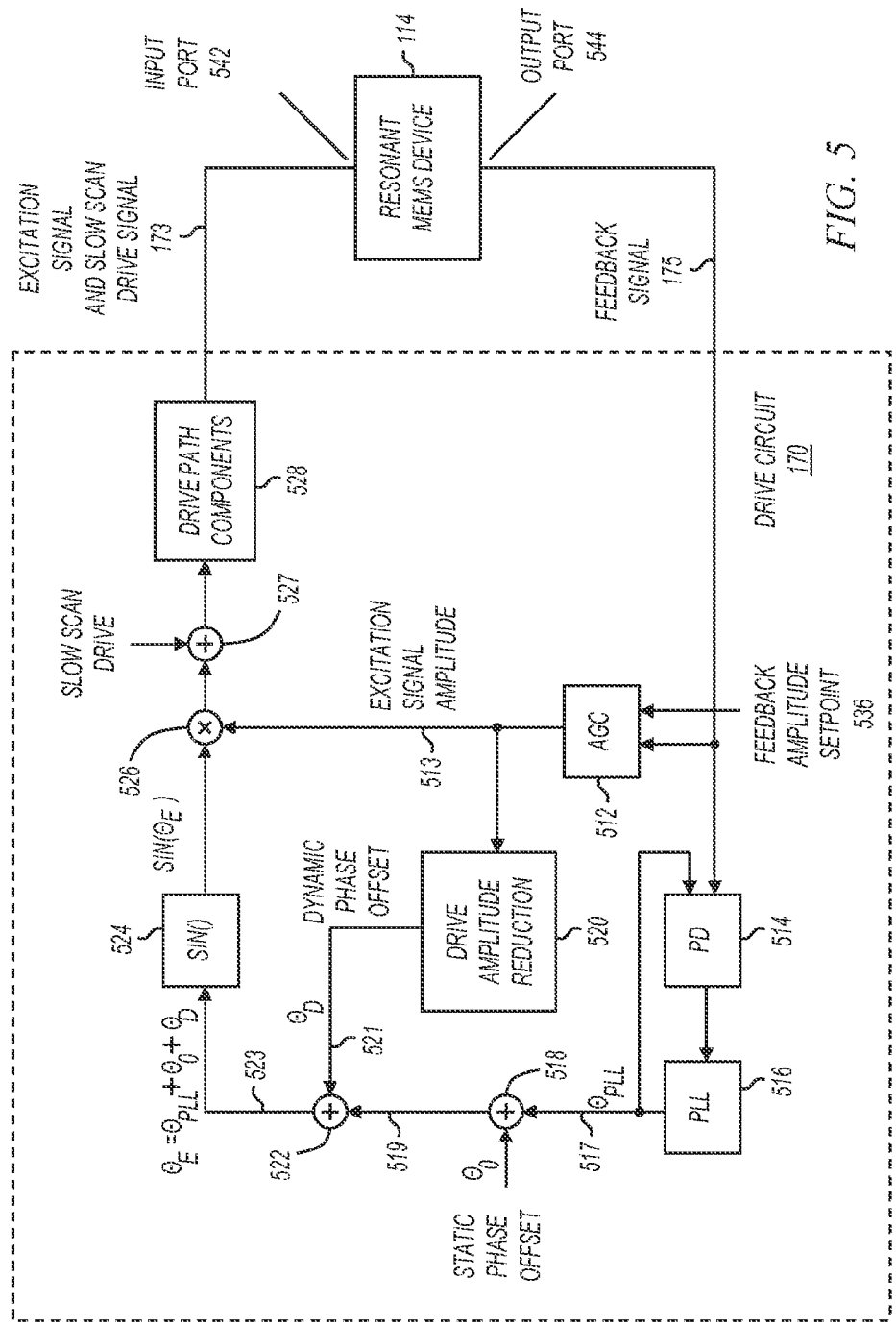
FIG. 5 shows a drive circuit and resonant MEMS device in accordance with various embodiments of the present invention.

FIG. 5 shows a drive circuit and resonant MEMS device in accordance with various embodiments of the present invention. Drive circuit 170 and resonant MEMS device correspond to the same devices shown as part of scanning laser projector 100 (FIG. 1).

Resonant MEMS device 114 includes input port 542 and output port 544. Input port 542 is coupled to receive the drive signal on node 173, and output port 544 is coupled to provide the feedback signal on node 175. Input port 542 and output port 544 correspond to signal pads on MEMS device 114 (FIG. 2).

Drive circuit 170 includes circuits that form multiple feedback loops and a controller to excite resonant MEMS device 114 such that the amplitude of the feedback signal on node 175 remains substantially constant. In some embodiments, this corresponds to a constant oscillatory amplitude of resonant MEMS device 114.

Drive circuit 170 includes automatic gain control (AGC) circuit 512, phase detector (PD) 514, phase locked loop (PLL) 516, summers 518 and 522, sin wave generator 524, multiplier 526, summer 527, drive path components 528, and drive amplitude reduction circuit 520.

The excitation signal that is part of the drive signal on node 173 is in the form of a synthesized tone having an amplitude and a phase, and can be expressed in the standard form of a sinusoid:

$$x(t)=A\sin(2\pi ft+\phi) \quad (1)$$

where x(t) is the excitation signal, A is the amplitude of the excitation signal, $f$ is the frequency, and $\phi$ is the phase of the excitation signal.

The frequency ($f$) of the excitation signal is controlled by a digital PLL by means of adjusting a phase accumulator to match the zero-crossing (hsync) timing of the resonant MEMS device feedback. This first feedback loop runs significantly faster than one or more other loops in the system and thus can be considered to be instantaneously locked from the perspective of any simultaneously executing slower loops.

The excitation signal amplitude on node 513 is controlled by an automatic gain control (AGC) loop which utilizes peak detection information from the feedback to satisfy a maximum mirror deflection set point. This second feedback loop typically operates slower than the first feedback loop, and in some embodiments, one or two orders of magnitude slower than the first feedback loop. For example, in some embodiments, the first feedback loop may operate at about 30 KHz, and the second feedback loop may operate at about 400 Hz. In operation, AGC 512 sets the excitation signal amplitude on node 513 and multiplier 526 applies that amplitude to the normalized sinusoid output from sin wave generator 524 to create the excitation signal.

The instantaneous phase $\phi$ of the excitation signal is controlled (offset) using summers 518 and 522. Summer 518 adds in a static phase offset, and summer 522 adds in a dynamic offset. The dynamic offset is provided by drive amplitude reduction circuit 520. Drive amplitude reduction circuit 520 functions to modify the excitation signal phase in an effort to reduce the amplitude of the excitation signal as shown in FIG. 4. This is described in more detail below.

In operation, drive circuit 170 receives the feedback signal on node 175 from resonant MEMS device 114. In some embodiments, the feedback signal represents an instantaneous angular displacement of the scanning mirror 116, and in other embodiments, the feedback signal represents an amplitude (maximum angular extents) of the oscillation of the scanning mirror 116 and a sync (or zero crossing) signal that imparts phase information. The feedback signal is provided to AGC 512 and PD 514.

AGC 512 compares the amplitude of the feedback signal to a feedback amplitude setpoint 536. Feedback amplitude setpoint 536 represents the desired constant amplitude value of the resonant operation of resonant MEMS device 114. In some embodiments, AGC 512 includes a peak detector to determine the maximum amplitude of the feedback signal prior to comparing it to the feedback amplitude setpoint.

In response to the comparison between the feedback signal and the setpoint, AGC 512 produces an excitation signal amplitude on node 513. In general, when the feedback signal has an amplitude less than the setpoint, AGC 512 increases the excitation signal amplitude, and when the feedback signal has an amplitude greater than the setpoint, AGC 312 decreases the excitation signal amplitude. The bandwidth of this amplitude feedback loop is large enough, and the excitation signal amplitude step size is small enough, that the amplitude of feedback signal 175 remains substantially constant.

In some embodiments, PD 514 measures a phase difference between zero crossing information provided in the feedback signal and the phase value on node 517 produced by PLL 517. This allows the system to track the resonant frequency at which resonant MEMS device 114 is operating.

PLL 516 synthesizes a phase value $\Theta_{PLL}$ that changes every clock cycle. In some embodiments, PLL 516 includes a phase accumulator (not shown) that sums a phase increment for each clock cycle to create $\Theta_{PLL}$. The rate of change of this phase value sets the frequency of the excitation signal. The rate of change of $\Theta_{PLL}$ is modified based on the output of PD 514 to track the frequency of the resonant mode of resonant MEMS device 114.

Summer 518 sums a static phase offset $\Theta_0$ to the phase $\Theta_{PLL}$ a output from PLL 516. The output of summer 518 is provided on node 519. In some embodiments, the static phase offset is determined during manufacture or calibration of the system and is performed once. For example, drive path components 528 may include filters, amplifiers, and other circuit components that impart a phase delay to the excitation signal. These phase delays may be characterized on a static basis and the static phase offset may be used to offset the effects of these and other phase delays in the system.

Summer 522 sums a dynamic phase offset $\Theta_D$ to the output of summer 518. The dynamic phase offset is provided on node 521 by drive amplitude reduction circuit 520. Drive amplitude reduction circuit 520 receives the excitation signal amplitude value on node 513 and modifies the dynamic phase offset on node 521 in an effort to reduce the excitation signal amplitude. Drive amplitude reduction circuit 520 is described in more detail below.

Summer 522 outputs the sum of the PLL output phase, the static phase offset, and the dynamic phase offset on node 523. This phase value $\Theta_E$ is input to sin wave generator 524 to produce a sinusoid having instantaneous phase $\Theta_E$. In some embodiments, sin wave generator 524 implements a CORDIC algorithm, although this is not a limitation of the present invention. For example, a look up table may be used to map phase values to sin values. The result is the unit amplitude excitation signal $\sin(\Theta_E)$ which corresponds to the sinusoid of eq. (1) with a normalized amplitude.

Multiplier 526 multiplies the excitation signal amplitude with the unit amplitude excitation signal to produce a digital excitation signal having an amplitude and phase. This digital excitation signal is summed with a slow-scan drive signal by summer 527, and the result is provided to drive path components 528, which produce the final analog drive signal on node 173. The final analog drive signal includes the slow-scan drive signal used to cause deflection of the mirror on the slow-scan axis as well as the excitation signal that causes resonant motion of resonant MEMS device 114. Drive path components 528 may include any suitable components, including a digital-to-analog converter (DAC), filters, amplifiers, and the like.

Figure 6:
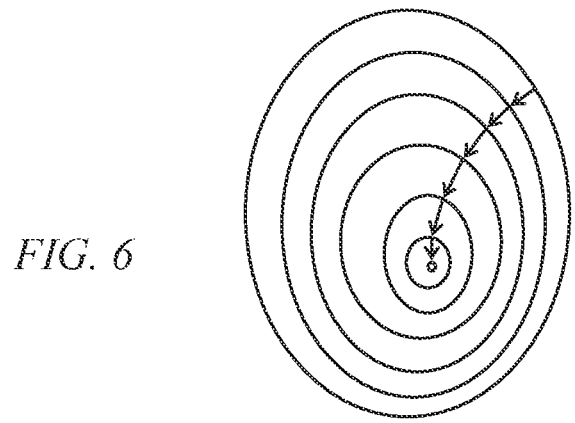
FIG. 6 shows a gradient descent trajectory in accordance with various embodiments of the present invention.

In some embodiments, drive amplitude reduction circuit 520 implements a gradient descent algorithm. Given an arbitrary, differentiable multivariate convex function $f(x)$ and some initial point $x_0$, $f(x)$ can be shown to decrease fastest toward $\min(f(x))$ if a step is made in the direction of the negative gradient of $f(x)$ evaluated at $x_0$. An example of a gradient descent trajectory is shown in FIG. 6.

Applied to a discrete algorithm, one can iterate over multiple steps (constrained by step size factor µ) to follow the gradient trajectory and converge at the function minimum where the gradient is equal to zero. The equation for the adaptation step can be expressed as:

$$x[n+1]=x[n]-\mu \nabla F(x[n]). \quad (2)$$

As described above, the gradient descent algorithm relies on a derivative (gradient) calculation of the function to be minimized. This is mathematically simple if an equation of the function is known, and can even be performed on a non-linear function by calculating updates from a Jacobian matrix (partial derivatives derived about a point).

Given an unknown, partially observable function, however, this becomes less straightforward. When used in conjunction with the system identification effort, the gradient descent methodology can still be employed in the form of a special type of adaptive controller.

The one-dimensional case for an adaptive gradient descent controller can be described using a minimum step size as follows. A minimum update step size ($\Delta x_{MIN}$) is defined that results in a sensed value that is above the noise floor of the system. Using a minimum step size implies that the gradient descent never converges completely to zero, but rather oscillates slightly about zero.

Given an initial state, a small perturbation is made to the system via the independent variable (actuator). This step is greater than or equal to the minimum step size.

The dependent variable is read (sensor) and its value is compared to its previous state. The difference (optionally normalized to the time step and the perturbation magnitude) serves as the partial derivative term for the gradient descent update calculation ($\delta F_x$).

Taking care to preserve the sign of the derivative, another update step is applied as per the modified gradient descent equation:

$$x[n+1]=x[n]\pm\max(|\mu\delta F_x|,\Delta x_{MIN}). \quad (3)$$

Additional actuation steps continue until the algorithm converges to a Pseudo-steady-state solution in the form of a small oscillation about a differential of zero. Because steps are always taken ($\geq \Delta x_{MIN}$), the partial derivative term is continuously updated, allowing the algorithm to adaptively track any time-varying changes to the global minimum being solved to. Note that a max step size ($\Delta x_{MAX}$) may also be employed to offer partial noise immunity.

Figure 7:
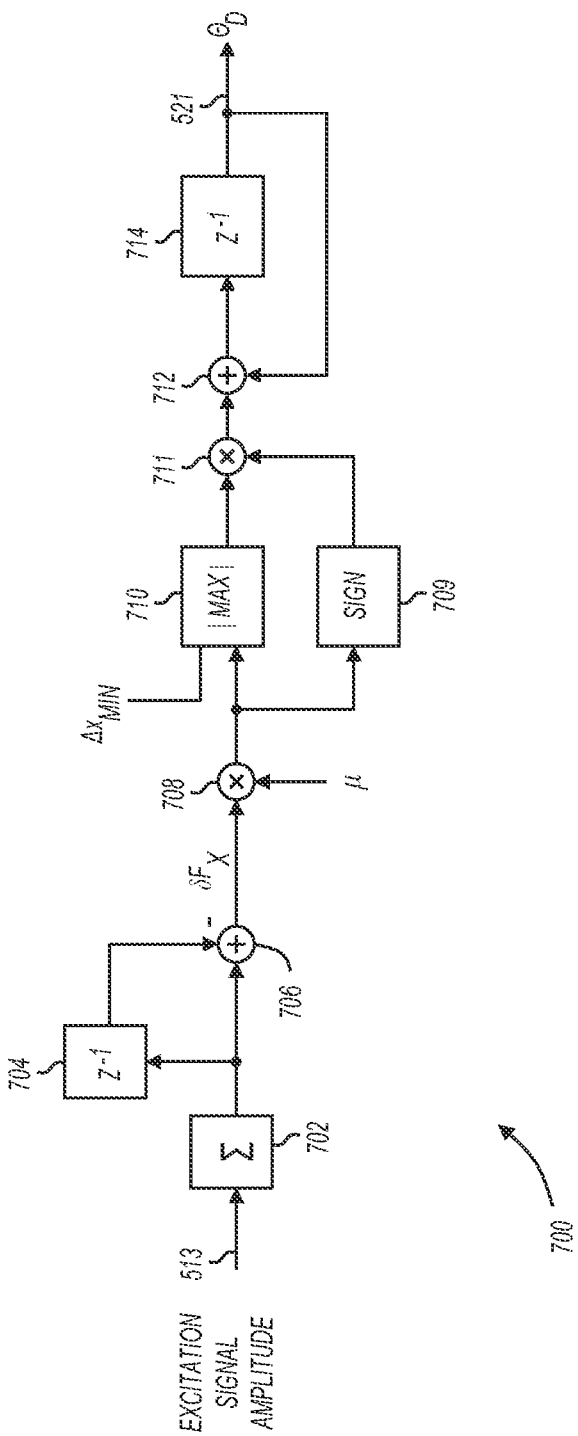
FIG. 7 shows a block diagram of a drive amplitude reduction circuit in accordance with various embodiments of the present invention.

FIG. 7 shows a block diagram of a drive amplitude reduction circuit in accordance with various embodiments of the present invention. Drive amplitude reduction circuit 700 may be used to implement drive amplitude reduction circuit 520 (FIG. 5). Drive amplitude reduction circuit 700 includes integrator 702, delay stages 704 and 714, summers 706 and 712, multiplier 708, and comparator 710. Collectively, the components of drive amplitude reduction circuit 700 implement a one-dimensional gradient descent algorithm with an unknown partially observable function as described above with reference to Eq. (3).

In operation, integrator 702 averages a number excitation signal amplitude samples. Delay stage 704 outputs the previous output of integrator 702, and summer 706 takes the difference between the two. This difference serves as proxy for the partial derivative term in the gradient descent update calculation ($\delta F_x$). Multiplier 708 applies gain value µ to the partial derivative term and then comparator 710 compares and selects the larger of the absolute values of $\Delta x_{MIN}$ and $\mu\delta F_x$ to be applied as the update. Summer 712 sums the previous dynamic phase value with the update, and this is the new dynamic phase value stored by delay stage 714 and presented on node 521.

Some embodiments omit integrator 702 and no averaging is performed. In other embodiments, the number of samples that are averaged by integrator 702 is dynamic. For example, at system start up when large phase errors are assumed, little or no averaging may be performed and noisy samples are used for the update calculation. After the phase update has settled, more averaging may be performed to reduce noise.

Similarly, in some embodiments, gain value μ is set to unity, and in other embodiments, it may be dynamic. For example, at system start up when large phase errors are assumed, a large gain value may be used so that phase update values are large until the phase update has settled, at which point the gain may be reduced to yield smaller step sizes eventually settling to $\Delta x_{MIN}$.

In some embodiments, drive amplitude samples and phase controller updates are done at the end of active video line at the frame rate (typically 50 or 60 Hz). In other embodiments, phase controller updates are performed less often. For example, a number ($N_{AVG}$) of drive amplitude samples may be averaged, and phase controller updates may be performed only every $N_{AVG}$ samples.

Figure 8:
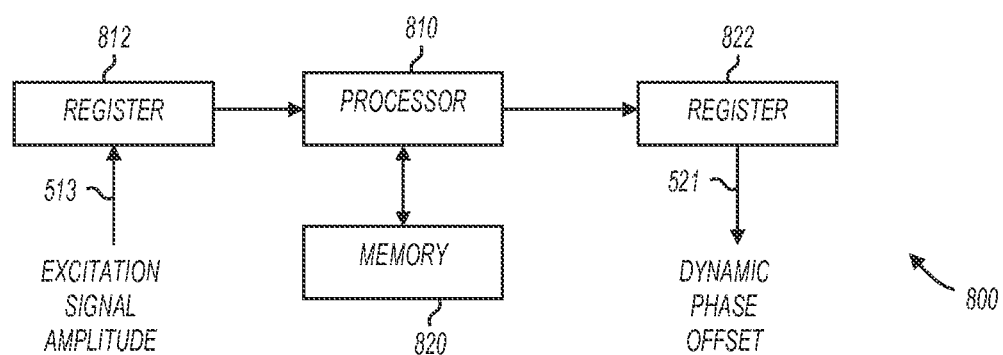
FIG. 8 shows a processor circuit in accordance with various embodiments of the present invention.

FIG. 8 shows a block diagram of a processor circuit in accordance with various embodiments of the present invention. Processor circuit 800 may implement drive amplitude reduction circuit 520. Processor circuit 800 includes processor 810, memory 820, and registers 812, 822. Memory 820 represents a non-transitory computer-readable medium that stores instructions. When the instructions are executed by processor 810, a drive amplitude reduction operation is performed. For example, in some embodiments, a gradient descent operation is performed when processor 810 executes instructions stored in memory 820. In operation, register 812 is coupled to receive the excitation signal amplitude on node 513, and the register contents are provided to processor 810. In addition, processor 810 determines a dynamic phase offset according to the various embodiments of the present invention and then provides the dynamic phase offset to register 822 where it is supplied on node 521 as described above with reference to FIG. 7.

Figure 9:
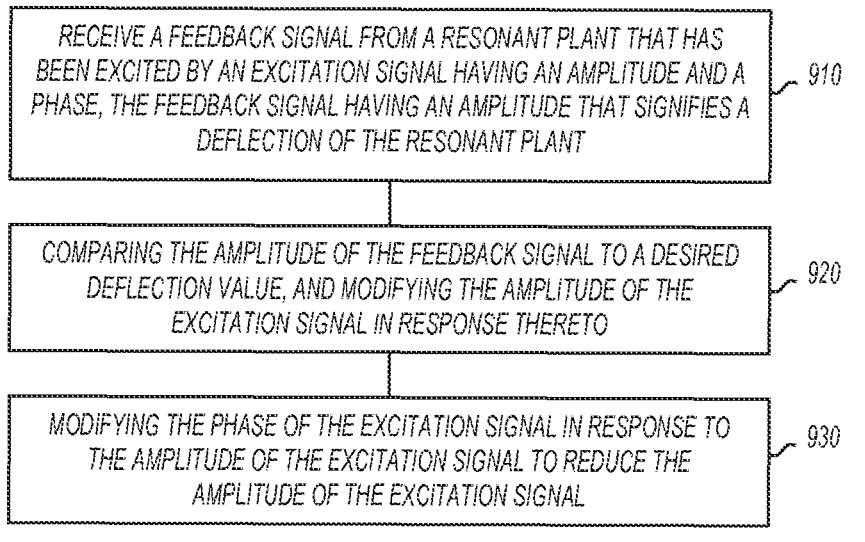
FIGS. 9 and 10 show flow diagrams of methods in accordance with various embodiments of the present invention.

FIG. 9 shows a flow diagram of methods in accordance with various embodiments of the present invention. In some embodiments, method 900, or portions thereof, is performed by a drive circuit that controls a resonant plant such as a resonant MEMS device. In other embodiments, method 900 is performed by a series of circuits or an electronic system. Method 900 is not limited by the particular type of apparatus performing the method. The various actions in method 900 may be performed in the order presented, or may be performed in a different order. Further, in some embodiments, some actions listed in FIG. 9 are omitted from method 900.

Method 900 is shown beginning with block 910. As shown at 910, a feedback signal is received from a resonant plant that has been excited by an excitation signal having an amplitude and a phase, where the feedback signal has an amplitude that signifies a deflection of the resonant plant. This corresponds to feedback signal 175 being received by drive circuit 170.

At 920, the amplitude of the feedback signal is compared to a desired deflection value, and the amplitude of the excitation is modified in response thereto. This corresponds to the operation of AGC 512 where the excitation signal amplitude on node 513 is modified as a function of the feedback amplitude setpoint and the feedback signal on node 175.

At 930, the phase of the excitation signal is modified in response to the amplitude of the excitation signal to reduce the amplitude of the excitation signal. This corresponds to the operation of drive amplitude reduction circuit 520. In some embodiments, this further corresponds to the implementation of a gradient descent algorithm.

Figure 10:
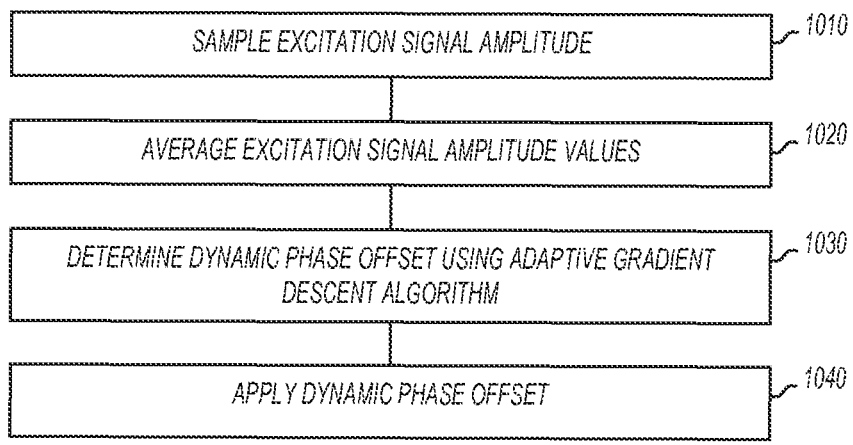

FIG. 10 shows a flow diagram of methods in accordance with various embodiments of the present invention. In some embodiments, method 1000, or portions thereof, is performed by a drive amplitude reduction circuit, such as drive amplitude reduction circuit 520, embodiments of which are shown in previous figures. In other embodiments, method 1000 is performed by a series of circuits or an electronic system. Method 1000 is not limited by the particular type of apparatus performing the method. The various actions in method 1000 may be performed in the order presented, or may be performed in a different order. Further, in some embodiments, some actions listed in FIG. 10 are omitted from method 1000.

Method 1000 is shown beginning with block 1010. As shown at 1010, the excitation signal amplitude is sampled. This corresponds to drive amplitude reduction circuit 520 sampling the excitation signal amplitude on node 513. At 1020, excitation signal amplitude values are averaged. In some embodiments, averaging is not employed. In other embodiments, two, five, 10, or more samples are averaged, or some other method of increasing SNR is used for noise reduction.

At 1030, a dynamic phase offset is determined using an adaptive gradient descent algorithm as described above, and at 1040, the dynamic phase offset is applied. This corresponds to drive amplitude reduction circuit 520 determining and applying the dynamic phase offset $\Theta_D$.

Figure 11:
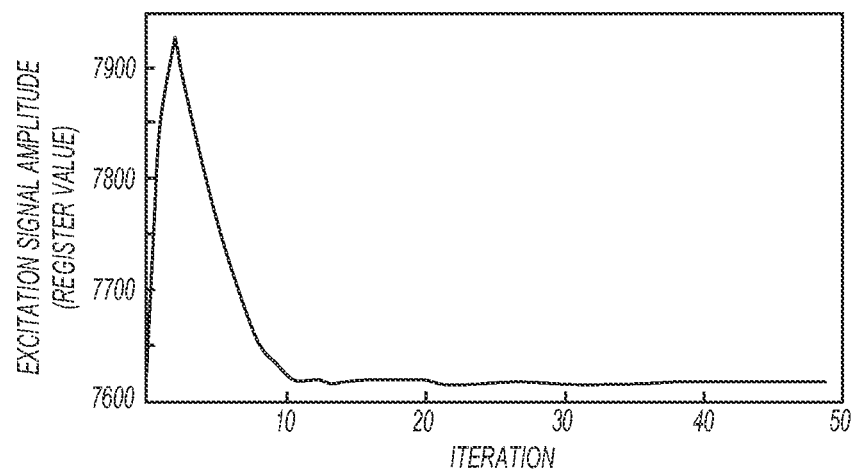
FIGS. 11 and 12 show plots of the operation of the drive circuit of FIG. 5 in accordance with various embodiments of the present invention.
Figure 12:
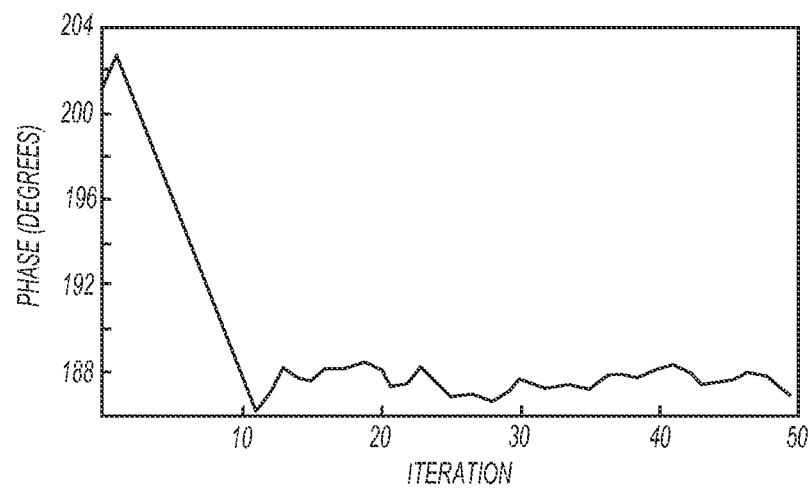

FIGS. 11 and 12 show plots of the operation of the drive circuit of FIG. 5 in accordance with various embodiments of the present invention. FIG. 12 shows a phase error that is intentionally injected into the excitation signal by abruptly modifying the static phase offset $\Theta_0$ (FIG. 5) by about 12 degrees. The gain feedback loop immediately responds by increasing the excitation signal amplitude as shown in FIG. 11 in order to keep the feedback signal amplitude substantially constant. Over about 10 iterations, the drive reduction circuit modifies the phase offset until the excitation signal amplitude reaches a local minimum.

Figure 13:
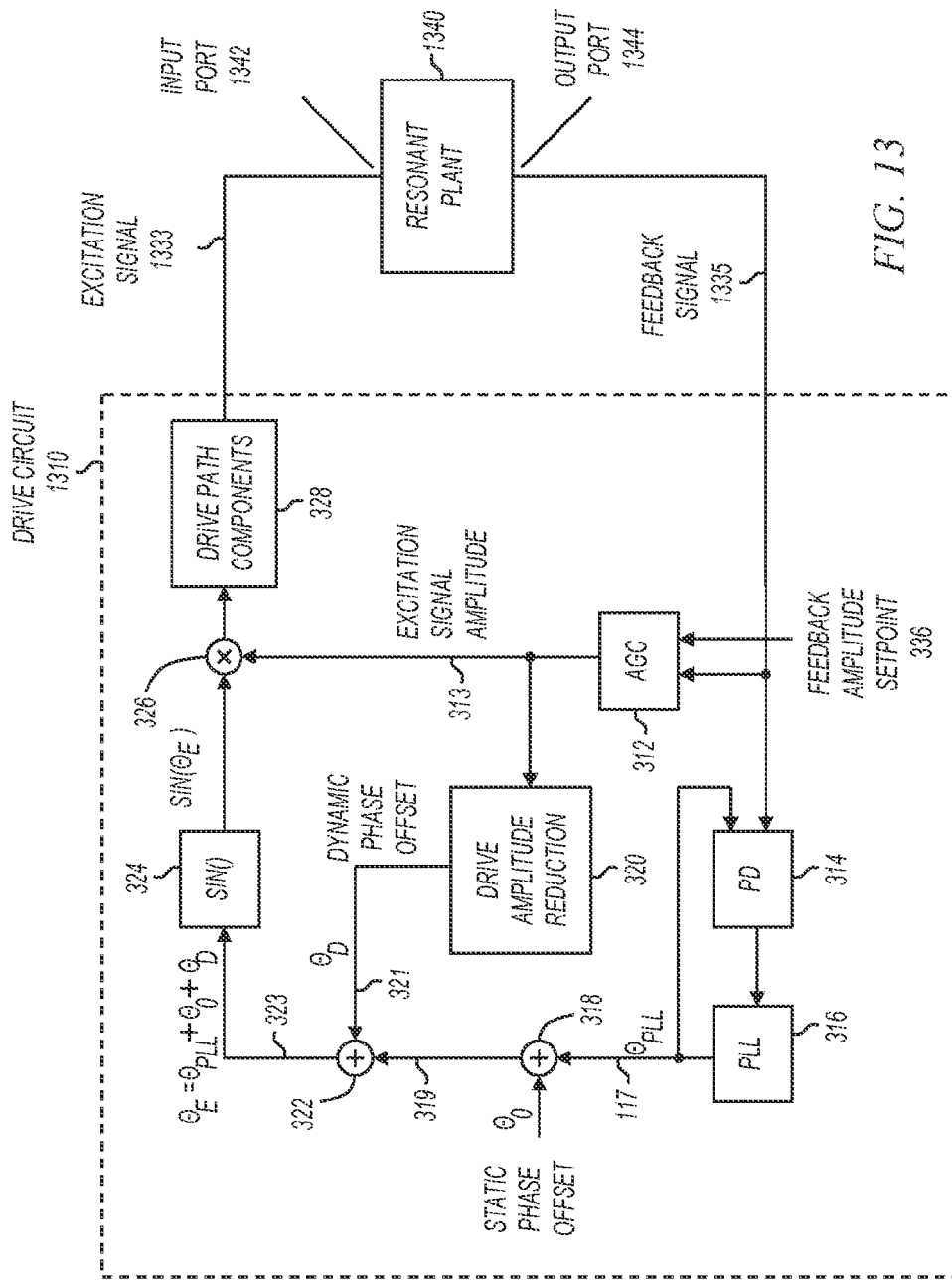
FIG. 13 shows a drive circuit and resonant plant in accordance with various embodiments of the present invention.

FIG. 13 shows a drive circuit and resonant plant in accordance with various embodiments of the present invention. The system of FIG. 13 is similar to the system of FIG. 5 with the exception that MEMS device 114 is replaced by resonant plant 140, and the drive signal does not include a slow-scan component.

Drive circuit 1310 includes all the components of drive circuit 170 except summer 527. Drive circuit 1310 provides an excitation signal on node 1333 and receives a feedback signal on node 1335.

Resonant plant 1340 includes input port 1342 coupled to receive the excitation signal and includes output port 1344 coupled to provide the feedback signal. Resonant plant 1340 represents any device or system having a resonant mode that can be excited when used as a control theory plant in a control system. For example, any device that has one or more resonant modes may be used as resonant plant 1340.

Figure 14:
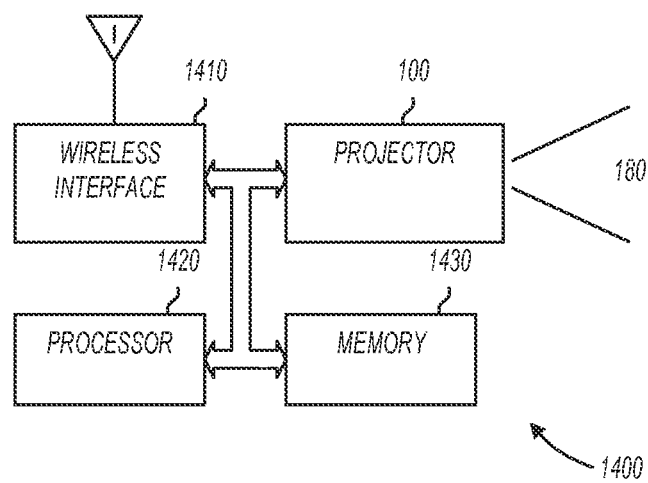
FIG. 14 shows a block diagram of a mobile device in accordance with various embodiments of the present invention.

FIG. 14 shows a block diagram of a mobile device in accordance with various embodiments of the present invention. As shown in FIG. 14, mobile device 1400 includes wireless interface 1410, processor 1420, memory 1430, and scanning laser projector 100. Scanning laser projector 100 includes excitation signal power reduction circuits as described above.

Scanning laser projector 100 may receive image data from any image source. For example, in some embodiments, scanning laser projector 100 includes memory that holds still images. In other embodiments, scanning laser projector 100 includes memory that includes video images. In still further embodiments, scanning laser projector 100 displays imagery received from external sources such as connectors, wireless interface 1410, a wired interface, or the like.

Wireless interface 1410 may include any wireless transmission and/or reception capabilities. For example, in some embodiments, wireless interface 1410 includes a network interface card (NIC) capable of communicating over a wireless network. Also for example, in some embodiments, wireless interface 1410 may include cellular telephone capabilities. In still further embodiments, wireless interface 1410 may include a global positioning system (GPS) receiver. One skilled in the art will understand that wireless interface 1410 may include any type of wireless communications capability without departing from the scope of the present invention.

Processor 1420 may be any type of processor capable of communicating with the various components in mobile device 1400. For example, processor 1420 may be an embedded processor available from application specific integrated circuit (ASIC) vendors, or may be a commercially available microprocessor. In some embodiments, processor 1420 provides image or video data to scanning laser projector 100. The image or video data may be retrieved from wireless interface 1410 or may be derived from data retrieved from wireless interface 1410. For example, through processor 1420, scanning laser projector 100 may display images or video received directly from wireless interface 1410. Also for example, processor 1420 may provide overlays to add to images and/or video received from wireless interface 1410, or may alter stored imagery based on data received from wireless interface 1410 (e.g., modifying a map display in GPS embodiments in which wireless interface 1410 provides location coordinates).

Figure 15:
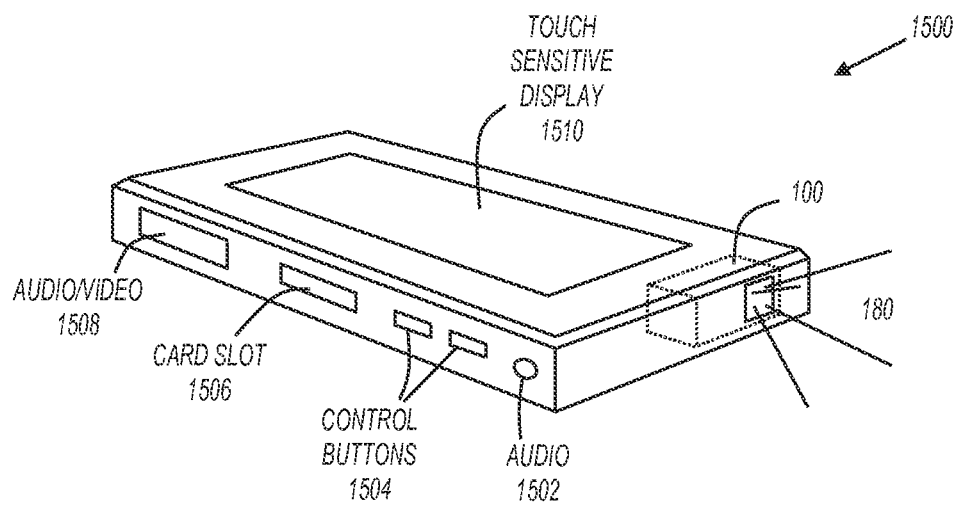
FIG. 15 shows a mobile device in accordance with various embodiments of the present invention.

FIG. 15 shows a mobile device in accordance with various embodiments of the present invention. Mobile device 1500 may be a hand held scanning laser projector with or without communications ability. For example, in some embodiments, mobile device 1500 may be a scanning laser projector with little or no other capabilities. Also for example, in some embodiments, mobile device 1500 may be a device usable for communications, including for example, a cellular phone, a smart phone, a tablet computing device, a global positioning system (GPS) receiver, or the like. Further, mobile device 1500 may be connected to a larger network via a wireless (e.g., cellular), or this device can accept and/or transmit data messages or video content via an unregulated spectrum (e.g., WiFi) connection.

Mobile device 1500 includes scanning laser projector 100, touch sensitive display 1510, audio port 1502, control buttons 1504, card slot 1506, and audio/video (A/V) port 1508. None of these elements are essential. For example, mobile device 1500 may only include scanning laser projector 100 without any of touch sensitive display 1510, audio port 1502, control buttons 1504, card slot 1506, or A/V port 1508. Some embodiments include a subset of these elements. For example, an accessory projector may include scanning laser projector 100, control buttons 1504 and A/V port 1508. A smartphone embodiment may combine touch sensitive display device 1510 and projector 100.

Touch sensitive display 1510 may be any type of display. For example, in some embodiments, touch sensitive display 1510 includes a liquid crystal display (LCD) screen. In some embodiments, display 1510 is not touch sensitive. Display 1510 may or may not always display the image projected by scanning laser projector 100. For example, an accessory product may always display the projected image on display 1510, whereas a mobile phone embodiment may project a video while displaying different content on display 1510. Some embodiments may include a keypad in addition to touch sensitive display 1510.

A/V port 1508 accepts and/or transmits video and/or audio signals. For example, A/V port 1508 may be a digital port, such as a high definition multimedia interface (HDMI) interface that accepts a cable suitable to carry digital audio and video data. Further, A/V port 1508 may include RCA jacks to accept or transmit composite inputs. Still further, A/V port 1508 may include a VGA connector to accept or transmit analog video signals. In some embodiments, mobile device 1500 may be tethered to an external signal source through A/V port 1508, and mobile device 1500 may project content accepted through A/V port 1508. In other embodiments, mobile device 1500 may be an originator of content, and A/V port 1508 is used to transmit content to a different device.

Audio port 1502 provides audio signals. For example, in some embodiments, mobile device 1500 is a media recorder that can record and play audio and video. In these embodiments, the video may be projected by scanning laser projector 100 and the audio may be output at audio port 1502.

Mobile device 1500 also includes card slot 1506. In some embodiments, a memory card inserted in card slot 1506 may provide a source for audio to be output at audio port 1502 and/or video data to be projected by scanning laser projector 100. Card slot 1506 may receive any type of solid state memory device, including for example secure digital (SD) memory cards.

Figure 16:
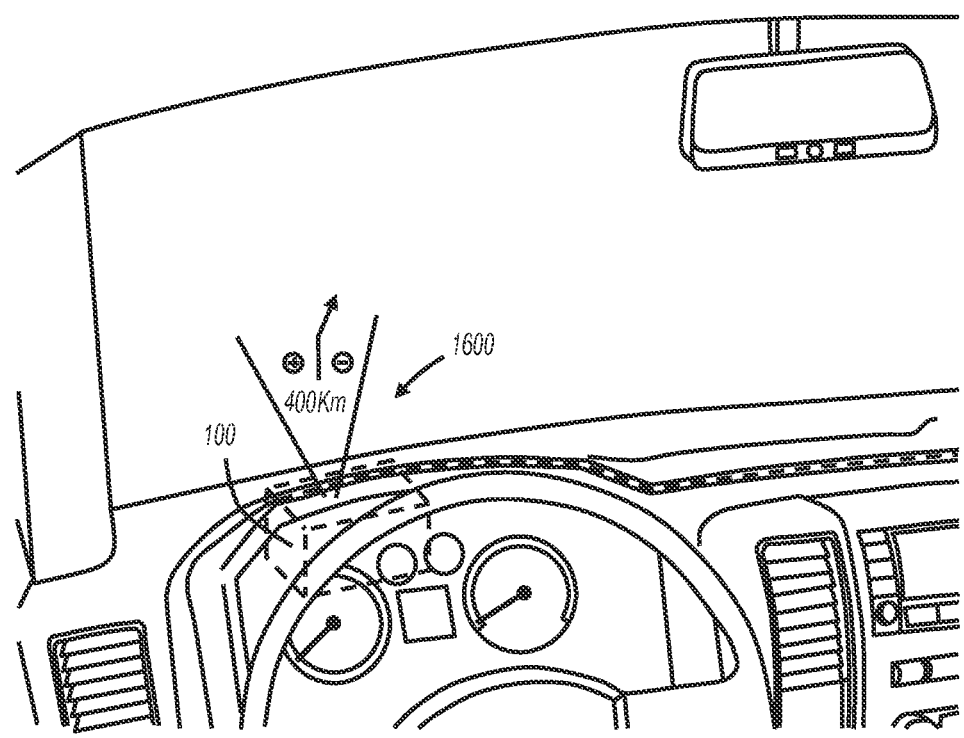
FIG. 16 shows a head-up display system in accordance with various embodiments of the present invention.

FIG. 16 shows a head-up display system in accordance with various embodiments of the invention. Projector 100 is shown mounted in a vehicle dash to project the head-up display at 1600. Although an automotive head-up display is shown in FIG. 16, this is not a limitation of the present invention. For example, various embodiments of the invention include head-up displays in avionics application, air traffic control applications, and other applications.

Figure 17:
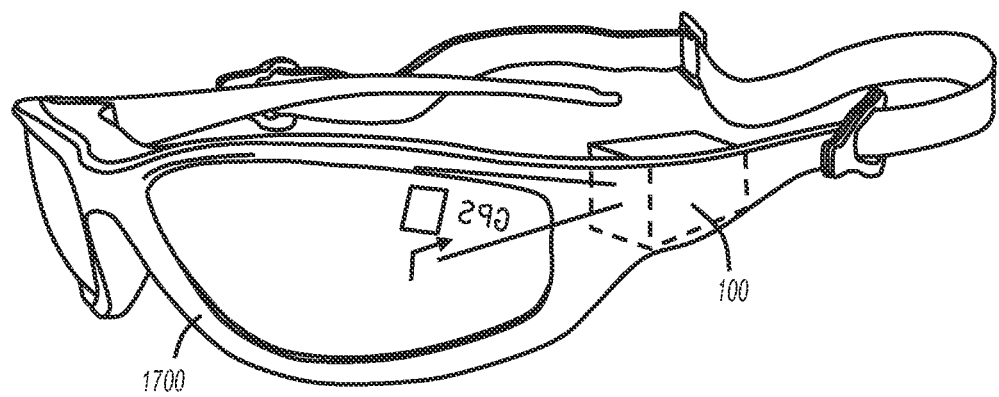
FIG. 17 shows eyewear in accordance with various embodiments of the present invention.

FIG. 17 shows eyewear in accordance with various embodiments of the invention. Eyewear 1700 includes projector 100 to project a display in the eyewear's field of view. In some embodiments, eyewear 1700 is see-through and in other embodiments, eyewear 1700 is opaque. For example, eyewear 1700 may be used in an augmented reality application in which a wearer can see the display from projector 100 overlaid on the physical world. Also for example, eyewear 1700 may be used in a virtual reality application, in which a wearer's entire view is generated by projector 100. Although only one projector 100 is shown in FIG. 17, this is not a limitation of the present invention. For example, in some embodiments, eyewear 1700 includes two projectors; one for each eye.

Figure 18:
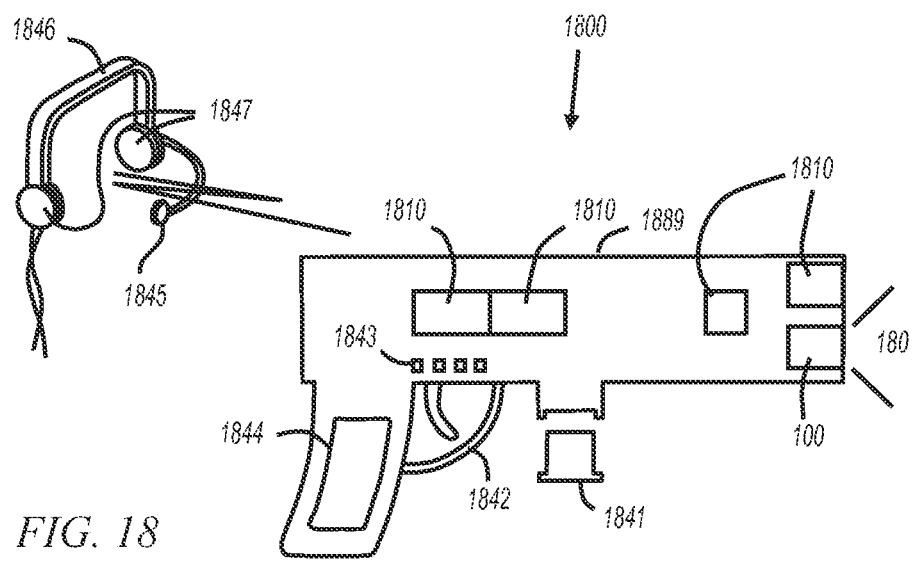
FIGS. 18 and 19 show gaming apparatus in accordance with various embodiments of the present invention.

FIG. 18 shows a gaming apparatus in accordance with various embodiments of the present invention. Gaming apparatus 1800 allows a user or users to observe and interact with a gaming environment. In some embodiments, the game is navigated based on the motion, position, or orientation of gaming apparatus 1800, an apparatus that includes scanning laser projector 100.

Other control interfaces, such as manually-operated buttons, foot pedals, or verbal commands, may also contribute to navigation around, or interaction with the gaming environment. For example, in some embodiments, trigger 1842 contributes to the illusion that the user or users are in a first person perspective video game environment, commonly known as a "first person shooter game." Because the size and brightness of the projected display can be controlled by the gaming application in combination with the user's movement, gaming apparatus 1800 creates a highly believable or "immersive" environment for these users.

Many other first person perspective simulations can also be created by gaming apparatus 1800, for such activities as 3D seismic geo-prospecting, spacewalk planning, jungle canopy exploration, automobile safety instruction, medical education, etc. Tactile interface 1844 may provide a variety of output signals, such as recoil, vibration, shake, rumble, etc. Tactile interface 1844 may also include a touch-sensitive input feature, such as a touch sensitive display screen or a display screen that requires a stylus. Additional tactile interfaces, for example, input and/or output features for a motion sensitive probe are also included in various embodiments of the present invention.

Gaming apparatus 1800 may also include audio output devices, such as integrated audio speakers, remote speakers, or headphones. These sorts of audio output devices may be connected to gaming apparatus 1800 with wires or through a wireless technology. For example, wireless headphones 1846 provide the user with sound effects via a BLUETOOTH™ connection, although any sort of similar wireless technology could be substituted freely. In some embodiments, wireless headphones 1846 may include microphone 1845 or binaural microphone 1847, to allow multiple users, instructors, or observers to communicate. Binaural microphone 1847 typically includes microphones on each ear piece, to capture sounds modified by the user's head shadow. This feature may be used for binaural hearing and sound localization by other simulation participants.

Gaming apparatus 1800 may include any number of sensors 1810 that measure ambient brightness, motion, position, orientation, and the like. For example, gaming apparatus 1800 may detect absolute heading with a digital compass, and detect relative motion with an x-y-z gyroscope or accelerometer. In some embodiments, gaming apparatus 1800 also includes a second accelerometer or gyroscope to detect the relative orientation of the device, or its rapid acceleration or deceleration. In other embodiments, gaming apparatus 1800 may include a Global Positioning Satellite (GPS) sensor, to detect absolute position as the user travels in terrestrial space.

Gaming apparatus 1800 may include battery 1841 and/or diagnostic lights 1843. For example, battery 1841 may be a rechargeable battery, and diagnostic lights 1843 could indicate the current charge of the battery. In another example, battery 1841 may be a removable battery clip, and gaming apparatus 1800 may have an additional battery, electrical capacitor or super-capacitor to allow for continued operation of the apparatus while the discharged battery is replaced with a charged battery. In other embodiments, diagnostic lights 1843 can inform the user or a service technician about the status of the electronic components included within or connected to this device. For example, diagnostic lights 1843 may indicate the strength of a received wireless signal, or the presence or absence of a memory card. Diagnostic lights 1843 could also be replaced by any small screen, such as an organic light emitting diode or liquid crystal display screen. Such lights or screens could be on the exterior surface of gaming apparatus 1800, or below the surface, if the shell for this apparatus is translucent or transparent.

Other components of gaming apparatus 1800 may be removable, detachable or separable from this device. For example, scanning laser projector 100 may be detachable or separable from gaming housing 1889. In some embodiments, the subcomponents of scanning laser projector 100 may be detachable or separable from gaming housing 1889, and still function.

Figure 19:
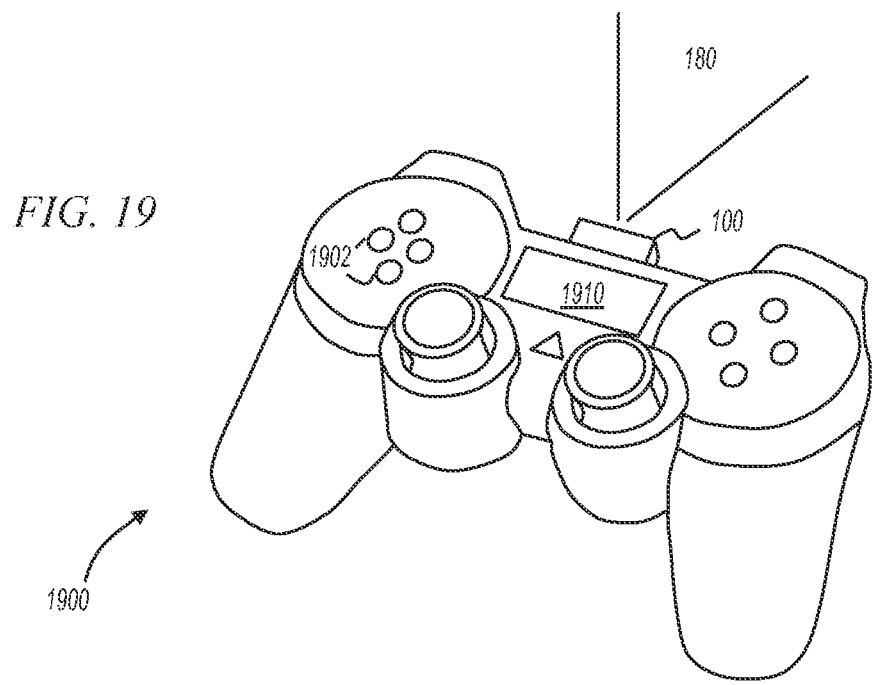

FIG. 19 shows a gaming apparatus in accordance with various embodiments of the present invention. Gaming apparatus 1900 includes buttons 1902, display 1910, and projector 100. In some embodiments, gaming apparatus 1900 is a standalone apparatus that does not need a larger console for a user to play a game. For example, a user may play a game while watching display 1910 and/or the projected content at 180. In other embodiments, gaming apparatus 1900 operates as a controller for a larger gaming console. In these embodiments, a user may watch a larger screen tethered to the console in combination with watching display 1910 and/or projected content at 180.

Although the present invention has been described in conjunction with certain embodiments, it is to be understood that modifications and variations may be resorted to without departing from the scope of the invention as those skilled in the art readily understand. Such modifications and variations are considered to be within the scope of the invention and the appended claims.

What is claimed is:

1. A scanning laser projector comprising:
   at least one source of laser light;
   a scanning mirror to reflect the laser light, the scanning mirror having a position sensor to provide a position feedback signal; and
   a drive circuit to provide an excitation signal to excite resonant motion of the scanning mirror, the excitation signal having an amplitude and a phase, the drive circuit including a first feedback circuit to modify the amplitude of the excitation signal in response to the position feedback signal, and a second feedback circuit to modify the phase of the excitation signal in response to the amplitude of the excitation signal.

2. The scanning laser projector of claim 1 wherein the second feedback circuit employs a gradient descent algorithm to reduce the amplitude of the excitation signal by modifying the phase of the excitation signal.

3. The scanning laser projector of claim 1 wherein the second feedback circuit modifies the phase of the excitation signal using a fixed step size.

4. The scanning laser projector of claim 1 wherein the second feedback circuit modifies the phase of the excitation signal using a nonfixed step size.

5. The scanning laser projector of claim 1 wherein the scanning mirror comprises a biaxial Microelectromechanical (MEMS) mirror.

6. The scanning laser projector of claim 1 wherein the scanning mirror scans on one axis, the scanning laser projector further comprising a second mirror to scan on a second axis.

7. The scanning laser projector of claim 1 wherein the scanning mirror comprises an electrostatically driven mirror.

8. A scanning laser projector comprising:
   at least one source of laser light;
   a scanning mirror to reflect the laser light, the scanning mirror having a position sensor to provide a position feedback signal; and
   a drive circuit to provide an excitation signal to excite resonant motion of the scanning mirror, the excitation signal having an amplitude and a phase, the drive circuit including a first feedback circuit to modify the amplitude of the excitation signal in response to the position feedback signal, and a second feedback circuit to modify the phase of the excitation signal in response to the amplitude of the excitation signal;

wherein a bandwidth of the first feedback circuit is greater than a bandwidth of the second feedback circuit.

9. The scanning laser projector of claim 8 wherein the second feedback circuit employs a gradient descent algorithm to reduce the amplitude of the excitation signal by modifying the phase of the excitation signal.

10. The scanning laser projector of claim 8 wherein the second feedback circuit modifies the phase of the excitation signal using a fixed step size.

11. The scanning laser projector of claim 8 wherein the second feedback circuit modifies the phase of the excitation signal using a nonfixed step size.

12. The scanning laser projector of claim 8 wherein the scanning mirror comprises a biaxial Microelectromechanical (MEMS) mirror.

13. The scanning laser projector of claim 8 wherein the scanning mirror scans on one axis, the scanning laser projector further comprising a second mirror to scan on a second axis.

14. The scanning laser projector of claim 8 wherein the scanning mirror comprises an electrostatically driven mirror.

* * * * *